(12) United States Patent
Kim

(10) Patent No.: US 7,745,300 B2
(45) Date of Patent: Jun. 29, 2010

(54) METHOD FOR FORMING A CAPACITOR IN A SEMICONDUCTOR AND A CAPACITOR USING THE SAME

(75) Inventor: Sang Kwon Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 515 days.

(21) Appl. No.: 11/473,737

(22) Filed: Jun. 23, 2006

(65) Prior Publication Data

US 2006/0292811 A1 Dec. 28, 2006

(30) Foreign Application Priority Data

Jun. 27, 2005 (KR) ....................... 10-2005-0055558

(51) Int. Cl.
*H01L 21/28* (2006.01)

(52) U.S. Cl. .............................. 438/393; 257/E21.011; 257/E29.343; 216/6

(58) Field of Classification Search ................. 438/250, 438/253, 393, 396; 257/306, 532, E29.343, 257/E21.011; 216/6
See application file for complete search history.

(56) References Cited

U.S. PATENT DOCUMENTS

| | | | | |
|---|---|---|---|---|
| 5,814,526 | A | * | 9/1998 | Tseng ........................ 438/396 |
| 6,333,224 | B1 | * | 12/2001 | Lee ............................. 438/243 |
| 6,492,224 | B1 | * | 12/2002 | Jao ............................ 438/241 |
| 2001/0022292 | A1 | * | 9/2001 | Hartner et al. ................. 216/6 |

\* cited by examiner

*Primary Examiner*—Mary Wilczewski
*Assistant Examiner*—Toniae M Thomas
(74) *Attorney, Agent, or Firm*—The Law Offices of Andrew D. Fortney; Andrew D. Fortney; Sharon E. Brown Turner

(57) ABSTRACT

Disclosed is a capacitor and method for forming a capacitor in a semiconductor. The method includes the steps of: (a) forming a lower electrode pattern on a silicon semiconductor substrate; (b) etching a portion of the lower electrode pattern to a predetermined depth to form a step in the lower electrode pattern; (c) forming a dielectric layer and a upper electrode layer on an entire surface of the substrate including the lower electrode pattern; and (e) patterning the upper electrode layer and the dielectric layer to form a upper electrode pattern and a dielectric pattern.

12 Claims, 5 Drawing Sheets

METHOD FOR FORMING A CAPACITOR IN A SEMICONDUCTOR AND A CAPACITOR USING THE SAME

This application claims the benefit of Korean Application No. 10-2005-0055558, filed on Jun. 27, 2005, which is incorporated by reference herein in its entirety.

BACKGROUND OF THE INVENTION

1. Field of the Invention

The present invention relates to a semiconductor device and a fabrication method thereof, and more specifically, to a capacitor and a method for forming the same.

2. Description of the Related Art

A variety of methods have been developed to implement simultaneously logic such as a CPU having a data processing function and memory having a data storage function. Furthermore, design techniques including analog, RF, etc., have been integrated into modern semiconductor manufacturing as well as logic and memory techniques.

Many elements including a transistor, a capacitor, and a resistor are integrated on a single chip in a semiconductor integrated circuit (IC). Efficient methods for implementing these elements have been diversely developed.

Capacitors, such as a PIP (Polysilicon/Insulator/Polysilicon) capacitor or a MIM (Metal/Insulator/Metal) capacitor, is often used in logic circuits such as CMOS logic. Such capacitors may be used in analog or digital circuits. Among these capacitors, a PIP capacitor is widely used for noise protection and frequency modulation. The bottom electrode and the top electrode of a PIP capacitor are manufactured using polysilicon. Polysilicon is also frequently used as a gate electrode material of a logic transistor so that the electrode of a PIP capacitor can be fabricated during the gate electrode's manufacturing.

FIG. 1 shows a semiconductor device having a PIP capacitor and a logic circuitry according to a conventional approach. As shown in FIG. 1, the device is divided into three parts i.e., a resistance region A, a capacitor region B, and a logic transistor region C.

A field area 3 determining an active area is defined in a substrate 1. A resistor 7 is formed in the resistance region A on the substrate. A PIP capacitor including a lower electrode 9, a dielectric layer 13, and an upper electrode 15 is formed in the region B. The MOS transistor including a gate electrode 11 and source/drain regions 10 is formed in the region C. The gate electrode 11 is formed on a gate insulating layer, while source/drain regions 10 are formed in the active area adjacent to the gate electrode.

A first ILD (Interlevel Dielectric) layer 17 and a second ILD layer 19 cover the top of the resistor, the PIP capacitor, and the transistor formed on the substrate. The contact plugs 21, 23, and 25 interconnect metal lines 27 and the elements on the substrate by penetrating these ILD layers 17 and 19. In a semiconductor device having the above-referred structure, the capacitance of a PIP capacitor is determined by the surface size of the dielectric layer disposed between a lower electrode and an upper electrode.

FIG. 2 shows a PIP capacitor according to a conventional art. Referring to FIG. 2, a PIP capacitor is formed from a lower electrode 9, a dielectric layer 13 and an upper electrode 15. The capacitance of the capacitor is determined by the surface size of the dielectric layer 13 between the upper electrode 9 and the lower electrode 15. A desired high capacitance can be obtained only by a relatively large line-width of polysilicon in the lower and the upper electrodes because the contact surface size of both electrodes determines the capacitance. For these reasons, currently, an analog device having a variety of characteristics in a substrate may have a lower cell density than other devices.

SUMMARY OF THE INVENTION

It is, therefore, an object of the present invention to provide a capacitor capable of increasing a cell density (particularly of an analog device) by securing a desired capacitance through a relatively narrow line-width, and a method for forming a capacitor having the same properties.

To achieve the above objects, an embodiment of a method for forming a capacity, according to the present invention, comprises the steps of: (a) forming a lower electrode pattern on a silicon semiconductor substrate; (b) etching a portion of the lower electrode pattern to a predetermined depth to form a step therein; (c) forming a dielectric layer and a upper electrode layer on an entire surface of the substrate including the lower electrode pattern; and (d) patterning the upper electrode layer and the dielectric layer to form a upper electrode pattern and a dielectric pattern.

In step (b) of the present method, a step is formed in the central region of the lower electrode pattern by etching edges of the lower electrode pattern, except for the central region of the lower electrode pattern. Also, step (a) may comprise the steps of: forming a first photoresist pattern having a predetermined line-width on a lower electrode layer; patterning the lower electrode layer using the first photoresist pattern as an etching mask; and removing the first photoresist pattern.

Furthermore, it is preferable that step (b) comprises the steps of: forming a second photoresist pattern having a line-width narrower than the line-width of the lower electrode pattern on the central region of the lower electrode pattern; etching edges of the lower electrode pattern to a predetermined depth using the second photoresist pattern as an etching mask; and removing the second photoresist pattern.

In addition, it is preferable that step (d) comprises: forming a third photoresist pattern on the upper electrode layer; patterning the upper electrode layer and the dielectric layer using the third photoresist pattern as an etching mask; and removing the third photoresist pattern. It is also preferable that the third photoresist pattern has a width greater than the line-width of the second photoresist pattern, but narrower (less) than the line-width of the first photoresist pattern. It is more preferable that the third photoresist pattern covers the central region of the lower electrode pattern having the step therein (e.g., formed using the second photoresist pattern).

The lower electrode layer and the upper electrode layer can comprise or be formed from polysilicon. Particularly, polysilicon doped with an impurity can be used. Preferably, the dielectric layer comprises a dielectric layer having an ONO structure.

The PIP capacitor of the present invention comprises: a polysilicon lower electrode having a step in a central region thereof, the step having a predetermined height; a dielectric layer on a top surface and side surface profile of the central region of the lower electrode; and a polysilicon upper electrode on the dielectric layer, having a line-width less than the line-width of the lower electrode.

Preferably, the lower electrode of the PIP capacitor according to the present invention is formed by the following steps of: forming a lower electrode layer on a semiconductor substrate; patterning the lower electrode layer to a predetermined line-width; forming the first photoresist pattern having a line-width narrower than the line-width of the lower electrode layer; and etching edges of the lower electrode to a predetermined depth using the first photoresist pattern as an etching mask to form a step in the central region of the lower electrode.

Furthermore, the dielectric layer and the upper electrode of the PIP capacitor according to the present invention can be made by: forming the dielectric layer and the upper electrode on the lower electrode having the step thereon; forming a second photoresist pattern on the upper electrode, having a width greater than the line-width of the first photoresist pattern and narrower than the line-width of the lower electrode; and patterning the dielectric layer and the upper electrode layer using the second photoresist pattern as an etching mask.

This and other aspects of the invention will become evident by reference to the following description of the invention, often referring to the accompanying drawings.

DETAILED DESCRIPTION OF THE INVENTION

Reference is made in detail to the embodiments of the present invention illustrated in the accompanying drawings. The same reference numbers are used throughout the drawings to refer to the same or similar parts.

Figure 3:
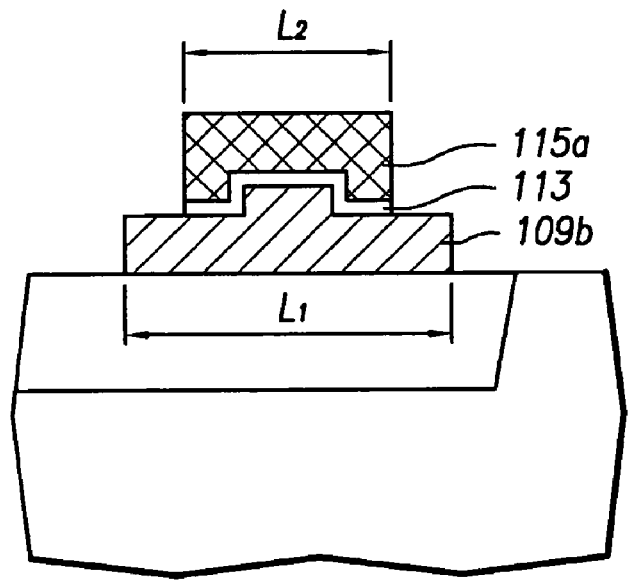
FIG. 3 is a cross-sectional view of a PIP capacitor according to the present invention.

FIG. 3 shows a PIP capacitor according to the present invention. As shown in FIG. 3, a lower electrode 109b, a dielectric layer 113, and an upper electrode 115a are deposited, in this order, on a substrate. The three dimensional lower electrode 109b having a step in the center can increase the capacitance of a capacitor by increasing the surface size of the dielectric layer in contact with the upper electrode 115. Methods for increasing the capacitance (C) of a capacitor include: decreasing a thickness (d) of a dielectric body, increasing a surface size (As) of an electrode, or using a dielectric material having a high dielectric constant. These methods result from the equation C=eAs/d (e: dielectric constant, As: the surface size of an electrode, and d: the thickness of a dielectric body). In a embodiment according to the present invention, a capacitor has electrodes with a complementary three dimensional surface structure so that the capacitor can obtain a desired (relatively high) capacitance, even though the line-width (L1) of the lower electrode and the line-width (L2) of the upper electrode of the PIP capacitor are the same or reduced relative to a capacitor manufactured in an otherwise identical process, but having electrodes with substantially two-dimensional (e.g., horizontal) opposing surface structures.

Figure 4:
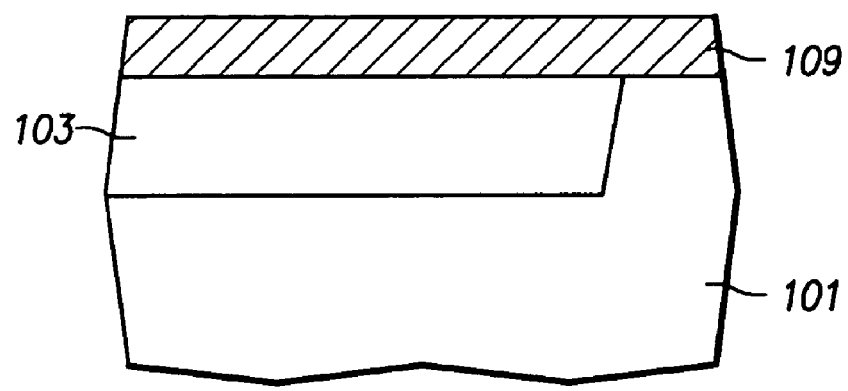
FIGS. 4 to 8 are cross-sectional views illustrating an embodiment of a method for forming a PIP capacitor according to the present invention.

FIGS. 4 to 8 illustrate a method for forming a PIP capacitor according to an embodiment of the present invention. As shown in FIG. 4, a field region 103 is formed in a semiconductor substrate 101, thereby defining a field area and an active area. Formation of the field region 103 may involve, in one embodiment, etching a portion of the substrate 101 selectively to form a trench, filling the trench with insulating material, and forming the field region 103 by a chemical mechanical polishing method. Subsequently, the lower polysilicon layer 109 is deposited (in one example, to a thickness of approximately 2,600 Å) over an entire surface of the substrate. Of course, the thickness of lower polysilicon layer 109 may be any predetermined, manufacturable value (e.g., from 1000 Å to 5000 Å).

Figure 1:
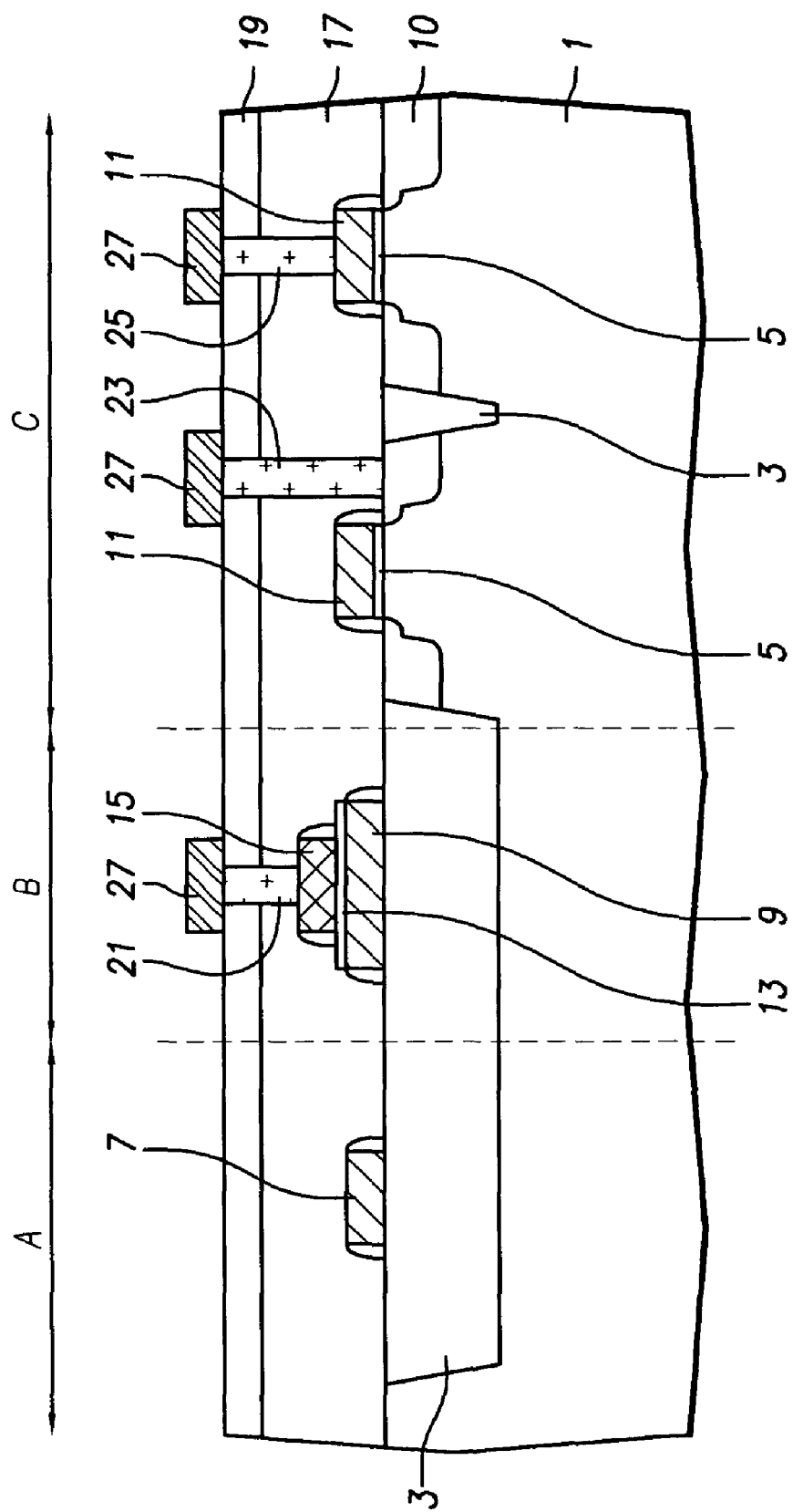
FIG. 1 is a cross-sectional view of a semiconductor device having a conventional PIP capacitor and logic circuitry.
Figure 2:
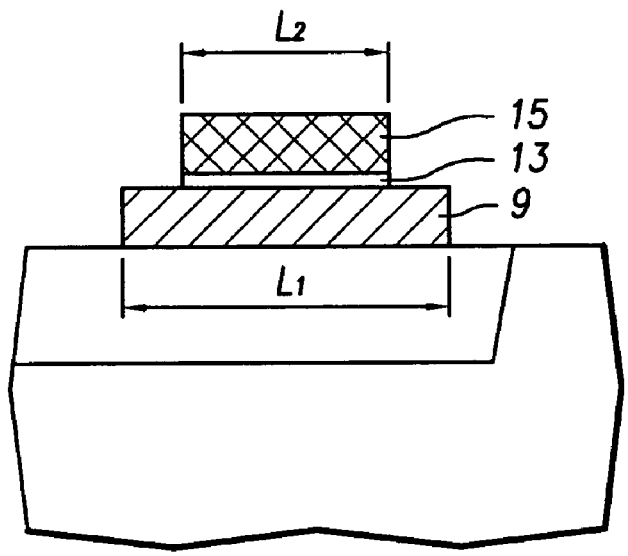
FIG. 2 is a cross-sectional view of a conventional PIP capacitor.
Figure 5:
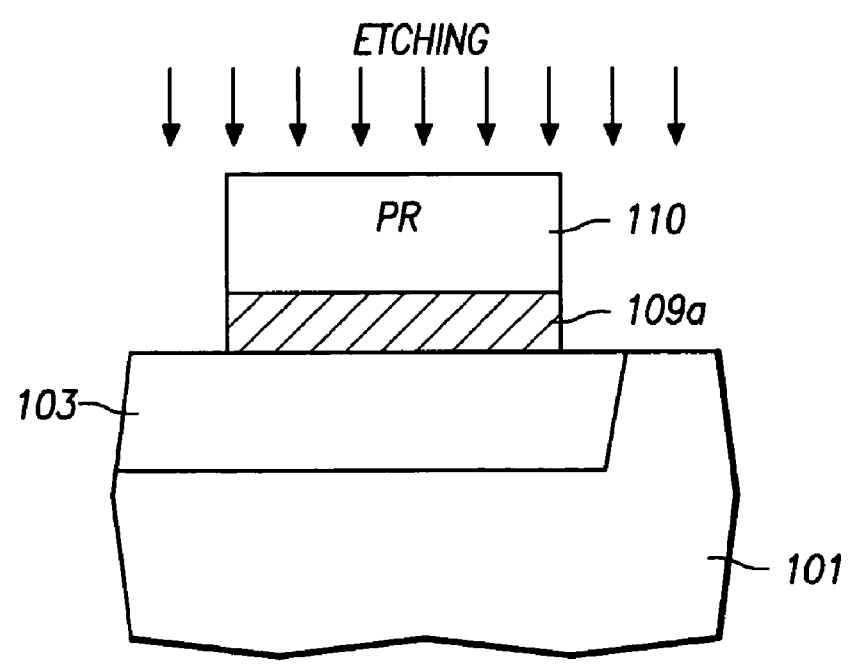

Referring to FIG. 5, a photoresist layer PR is applied over the entire substrate. Subsequently, a polysilicon pattern 109a is formed by patterning photoresist layer PR by a conventional photolithography and development process to form a photoresist pattern 110, then etching the lower polysilicon layer 109 using the photoresist pattern 110 as an etching mask. A resistor and/or a gate electrode can be patterned simultaneously during the patterning process of the lower polysilicon layer, but this process is not shown in FIG. 5. The cell density can be improved by reducing the line-width of the polysilicon pattern 109a to a value less than the lower electrode of a conventional PIP capacitor. For example, a desired, equal or similar capacitance can be secured or obtained in the present invention even though the line-width of the lower electrode is about 0.4 μm, and the line-width of the lower electrode according to the conventional art (see, e.g., FIG. 2) is about 0.5 μcm. The present invention can thus form a smaller capacitor than a conventional capacitor, and improve the cell density thereby. It is also possible that, in some embodiments, the capacitance can be increased by a predetermined amount, even as the cell density is improved.

Figure 6:
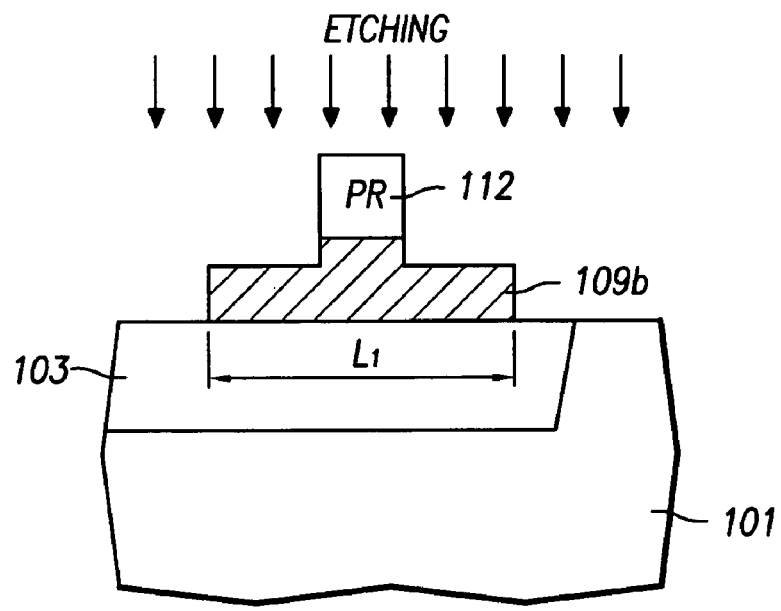

Next, as shown in FIG. 6, after removing the photoresist pattern 110, another photoresist layer is applied over the entire surface of the substrate, then a photoresist pattern 112 is formed on the lower polysilicon layer 109a by a conventional photolithography and development process. Newly formed photoresist pattern 112 is arranged in a central region of the lower polysilicon layer 109a. Although, in general, the photoresist pattern 110 will have a substantially linear or rectangular shape when viewed from the top, it may also have a serpentine shape or a shape having alternating narrow and wide portions (e.g., having a "hatched" shape with one relatively long, linear portion and a plurality of relatively short portions orthogonal to [and intersecting] the long, linear portion; e.g., ┼┼┼┼). The line-width of the photoresist pattern 112 is generally smaller than the line-width of the photoresist pattern 110 for forming the first lower polysilicon layer 109a. For example, if the line-width of lower polysilicon layer 109a is 0.4 μm, it would be desirable that the line-width of the photoresist pattern 112 is about 0.2 μm. Of course, other possibilities for line-widths of lower polysilicon layer 109a and photoresist pattern 112 exist, but in general, the line width ratio of photoresist pattern 112 to lower polysilicon layer 109a may be from 1:4 to 3:4. Subsequently, exposed regions (e.g., except for the central region) of the polysilicon pattern 109a are etched to a predetermined depth using the photoresist pattern 112 as an etching mask. Preferably, the polysilicon pattern 109a should not be etched entirely. For example, when the thickness of the lower electrode 109a is about 2600 Å, etching to a depth of about 1500 Å is desirable. However, the etching depth may be anywhere from, e.g., 20% to 80% of the lower electrode thickness. Such etching results in a polysilicon pattern having a step like the lower electrode 109b shown in FIG. 6. Therefore, if the lower electrode 109b has a step (e.g., a three-dimensional surface shape), the desired or improved capacitance can be secured even though the line-width of polysilicon is relatively narrow.

Figure 7:
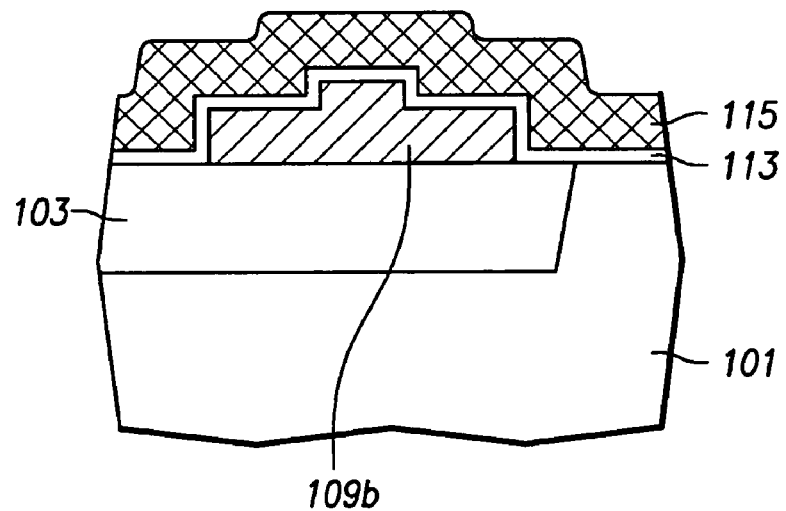

Referring to FIG. 7, after removing the photoresist pattern 112, a dielectric layer 113 and an upper polysilicon layer 115 are successively deposited on an entire surface of the substrate having the lower electrode 109b (e.g., by blanket-depositing or conformal deposition). The dielectric layer 113 can comprise an oxide (e.g., aluminum oxide or silicon dioxide, which may be doped with one or more dielectric constant-increasing dopants), a non-conducting nitride, or a combination thereof (e.g., an ONO, or Oxide-Nitride-Oxide, structure). For example, a HTO (High Temperature Oxidation) oxide layer, SiN, and SiO$_2$ can be formed, in this order, to respective thicknesses of about 50 Å/60 Å/300 Å. Next, the upper polysilicon layer 115 can have a thickness of 1500 Å and can be doped with a conventional dopant (e.g., phosphorus [P]). Of course, the thickness of the dielectric layer 113 may be determined according to the equation above for determining capacitance, and the thickness of upper polysilicon layer 115 can be any manufacturable value (e.g., from about 500 Å to about 3000 Å).

Figure 8:
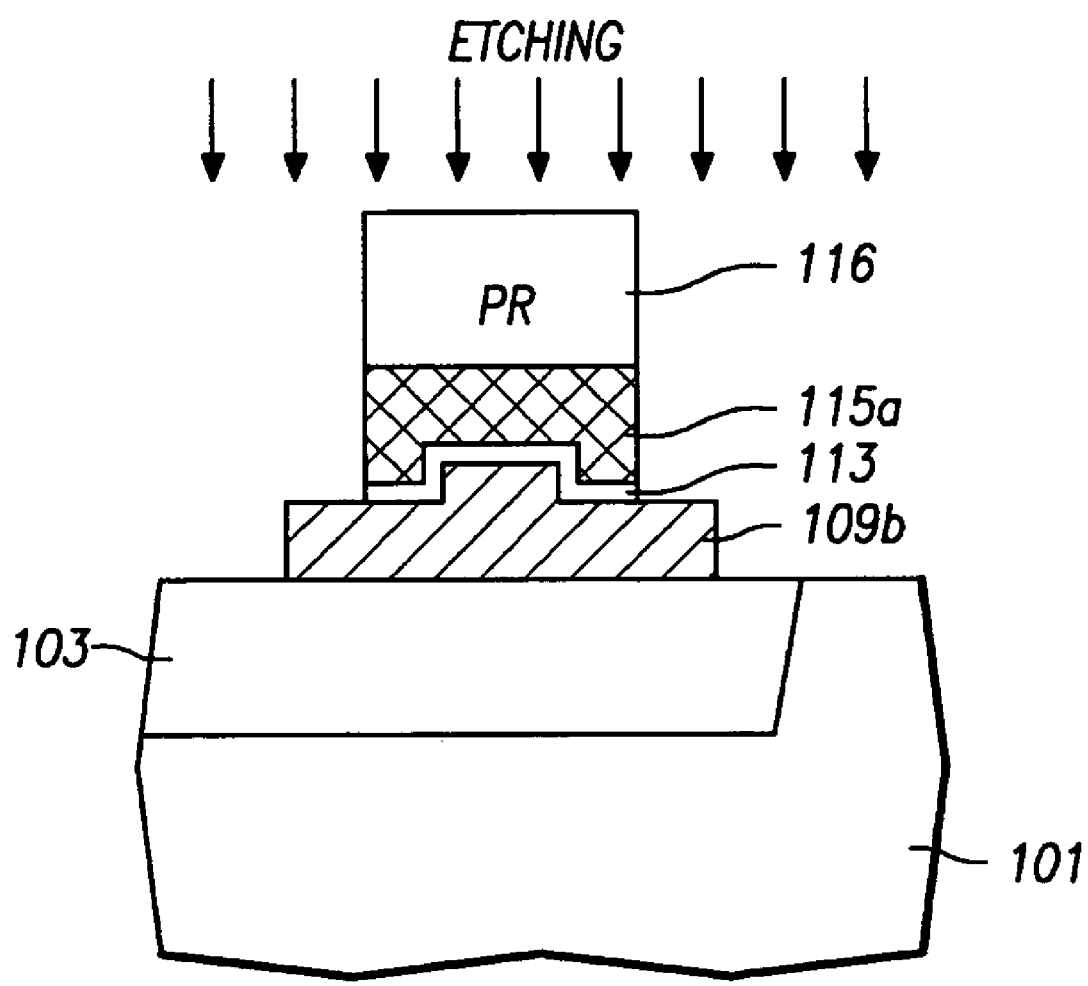

Finally, as shown in FIG. 8, after applying a photoresist over an entire surface of the substrate (e.g., the upper polysilicon layer 115), a photoresist pattern 116 is formed by a conventional photolithography and development process. Here, the photoresist pattern 116 covers at least the step portion in the lower polysilicon layer 109b. It is desirable that the photoresist layer pattern 116 has a line-width greater than the line-width of the photoresist pattern 112. For example, when photoresist pattern 112 has a line width of 0.2 µm, the photoresist pattern 116 can have a line-width of about 0.3 µm. Also, if the step in the lower polysilicon layer 109b has a shape other than linear or substantially rectangular, it is not necessary that the photoresist pattern 116 completely cover the entire step, although it is preferred that the photoresist pattern 116 completely cover the entire step (i.e., the line width of the photoresist pattern 116 is greater than the widest portion of photoresist pattern 112 or of the step).

The upper polysilicon layer 115 and the dielectric layer 113 are patterned using the photoresist pattern 116 as an etching mask. Next, removing the photoresist pattern 116 completes the PIP shown in FIG. 3. Here, when the upper polysilicon layer 115 is patterned, patterning of other elements (such as a resistor and/or a gate electrode) can be performed simultaneously.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a capacitor comprising:
   (a) depositing a lower electrode layer on a silicon semiconductor substrate, then patterning the lower electrode layer to form a lower electrode pattern on the silicon semiconductor substrate;
   (b) etching edges of the lower electrode pattern to a predetermined depth to form a step in a central region therein;
   (c) forming a dielectric layer and an upper electrode layer on an entire surface of the substrate, including the lower electrode pattern and the step; and
   (d) patterning the upper electrode layer and the dielectric layer to form an upper electrode pattern and a dielectric pattern.

2. The method according to claim 1, wherein patterning the lower electrode layer comprises:
   (i) forming a first photoresist pattern having a predetermined line-width on the lower electrode layer;
   (ii) patterning the lower electrode layer using the first photoresist pattern as an etching mask; and
   (iii) removing the first photoresist pattern.

3. The method according to claim 2, wherein forming the step in the central region of the lower electrode pattern comprises:
   (i) forming a second photoresist pattern having a line-width narrower than a line-width of the lower electrode pattern on the central region of the lower electrode pattern;
   (ii) etching edges of the lower electrode pattern to a predetermined depth using the second photoresist pattern as an etching mask; and
   (iii) forming the step by removing the second photoresist pattern.

4. The method according claim 3, wherein patterning the upper electrode layer and the dielectric layer comprises:
   (i) forming a third photoresist pattern on the upper electrode layer;
   (ii) patterning the upper electrode layer and the dielectric layer using the third photoresist pattern as an etching mask; and
   (iii) removing the third photoresist pattern.

5. The method according to claim 4, wherein the third photoresist pattern has a width greater than the line-width of the second photoresist pattern.

6. The method according to claim 5, wherein the third photoresist pattern has a width less than the line-width of the first photoresist pattern.

7. The method according to claim 4, wherein the third photoresist pattern covers the central region of the lower electrode pattern.

8. The method according to claim 1, wherein the lower electrode layer comprises polysilicon.

9. The method according to claim 8, wherein the upper electrode layer comprises polysilicon.

10. The method according to claim 1, wherein the upper electrode layer comprises polysilicon.

11. The method according to claim 1, wherein the dielectric layer comprises an ONO structure.

12. The method according to claim 9, wherein the polysilicon further comprises a dopant.

* * * * *